(12) United States Patent
Pamarti et al.

(10) Patent No.: US 10,924,060 B2
(45) Date of Patent: Feb. 16, 2021

(54) ULTRA-LOW-POWER OSCILLATOR WITH DC-ONLY SUSTAINING AMPLIFIER

(71) Applicant: THE REGENTS OF THE UNIVERSITY OF CALIFORNIA, Oakland, CA (US)

(72) Inventors: Sudhakar Pamarti, Irvine, CA (US); Hani Esmaeelzadeh, Culver City, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/726,721

(22) Filed: Dec. 24, 2019

(65) Prior Publication Data
US 2020/0220496 A1 Jul. 9, 2020

Related U.S. Application Data

(60) Provisional application No. 62/784,741, filed on Dec. 25, 2018.

(51) Int. Cl.
*H03B 5/36* (2006.01)
*H03B 5/04* (2006.01)
*H03L 7/081* (2006.01)

(52) U.S. Cl.
CPC ............... *H03B 5/364* (2013.01); *H03B 5/04* (2013.01); *H03L 7/0812* (2013.01); *H03B 2200/0012* (2013.01)

(58) Field of Classification Search
CPC ...................................... H03B 5/364
USPC ...................................... 331/116 R
See application file for complete search history.

(56) References Cited

U.S. PATENT DOCUMENTS 7,868,710 B1 * 1/2011 Farahvash ............. H03B 5/366
331/179
2004/0070461 A1 * 4/2004 Fredriksson ......... H03K 3/2823
331/135

* cited by examiner

*Primary Examiner* — Joseph Chang
(74) *Attorney, Agent, or Firm* — O'Banion & Ritchey LLP; John P. O'Banion

(57) ABSTRACT

An ultra-low power (ULP) oscillator that down-converts the current of a resonator to DC, then amplifies it when its still in DC, followed by up-converting the amplified signal back to the oscillation frequency. The disclosed oscillator eliminates the minimum transconductance (gm) requirement of a Pierce oscillator, by processing the signal at DC. In addition, the circuit only requires the DC amplifier's feedback resistor to be greater than the resistive loss of the resonator, i.e., Rf>Rm.

18 Claims, 15 Drawing Sheets

ULTRA-LOW-POWER OSCILLATOR WITH DC-ONLY SUSTAINING AMPLIFIER

CROSS-REFERENCE TO RELATED APPLICATIONS

This application claims priority to, and the benefit of, U.S. provisional patent application Ser. No. 62/784,741 filed on Dec. 25, 2018, incorporated herein by reference in its entirety.

STATEMENT REGARDING FEDERALLY SPONSORED RESEARCH OR DEVELOPMENT

This invention was made with government support under Grant Number 1329755, awarded by the National Science Foundation. The government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to oscillator circuits, and more particularly to an ultra-low-power oscillator circuit which requires only a direct current sustaining amplifier.

2. Background Discussion

Oscillators are one of the more widely-used circuit blocks in electronic systems. There are typically at least three different types of oscillators used in an electronic system: a reference oscillator (typically a high-Q crystal/MEMS oscillator); a sleep timer (a low-frequency, high-Q oscillator); and a high-frequency local oscillator. Ultra-low power (ULP) consumption of oscillators is critical in highly duty-cycled, energy-constrained systems such as Internet-of-things (IoT). Conventional high-Q oscillators, typically implemented in the Pierce configuration, as shown in FIG. 1, require high power consumption levels to ensure frequency stability over process, voltage, and temperature (PVT) variations.

Accordingly, a need exists for oscillators that operate at reduced power levels. The present disclosure fulfills that need and provides additional benefits over previous technologies.

BRIEF SUMMARY

A new ultra-low power (ULP) oscillator architecture is described that achieves the lowest reported power consumption. In one embodiment, instead of amplifying the oscillation signal from the resonator, the technology down-converts the resonator's current to DC, amplifies it at DC, then up-converts the amplified signal back to the oscillation frequency. By processing the signal at DC, the technique eliminates the frequency-dependent minimum transconductance (gm) requirement of a Pierce oscillator, and only requires that the feedback resistor of the DC amplifier be larger than the resistive loss of the resonator, i.e., Rf>Rm.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

An ultra-low power (ULP) oscillator architecture is described in the present disclosure which achieves the lowest reported power consumption.

Figure 1:
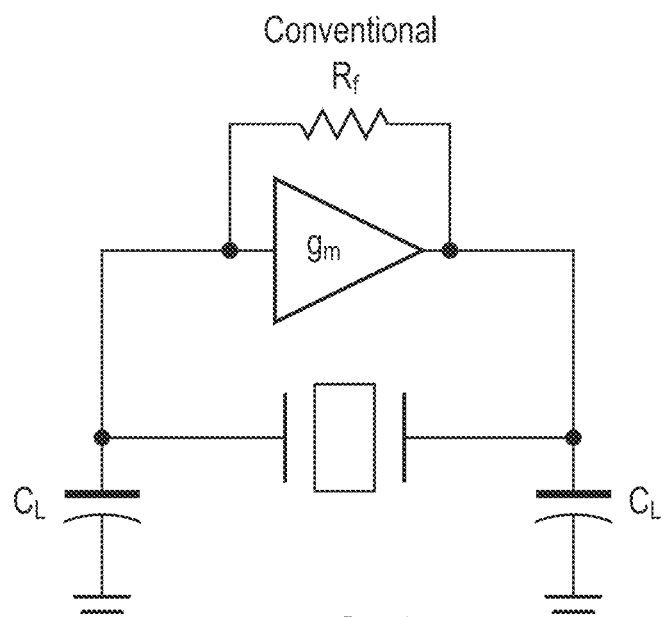
FIG. 1 is a block diagram of a conventional Pierce crystal oscillator (XO).
Figure 2A:
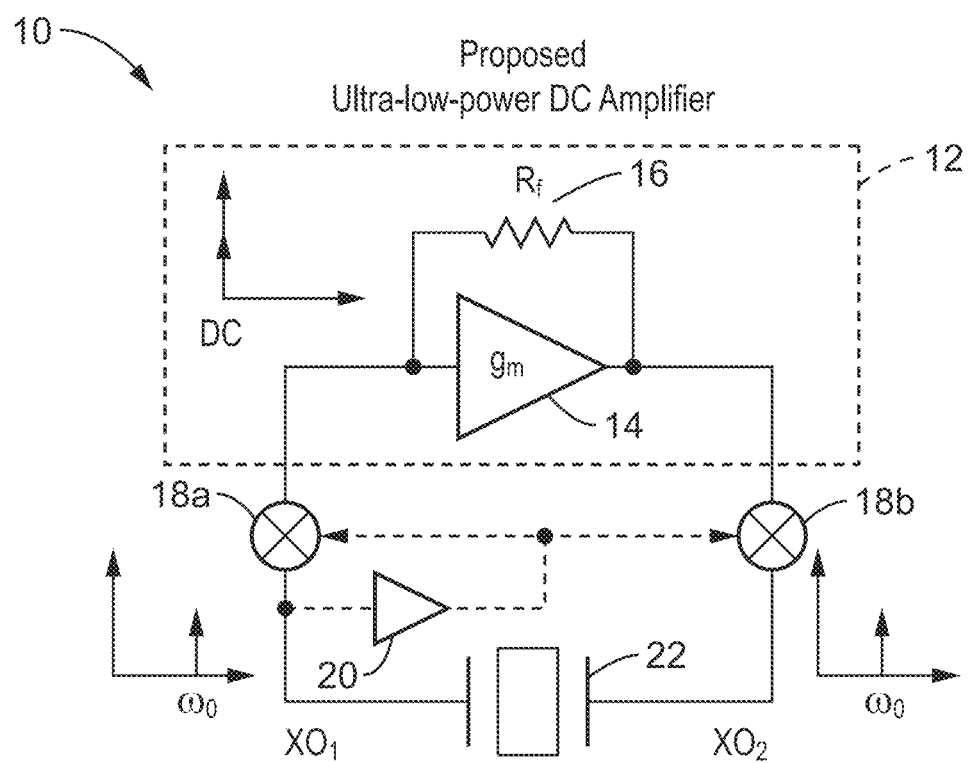
FIG. 2A and FIG. 2B are a circuit block diagram and waveforms of an ultra-low power (ULP) oscillator according to an embodiment of the present disclosure.
Figure 2B:
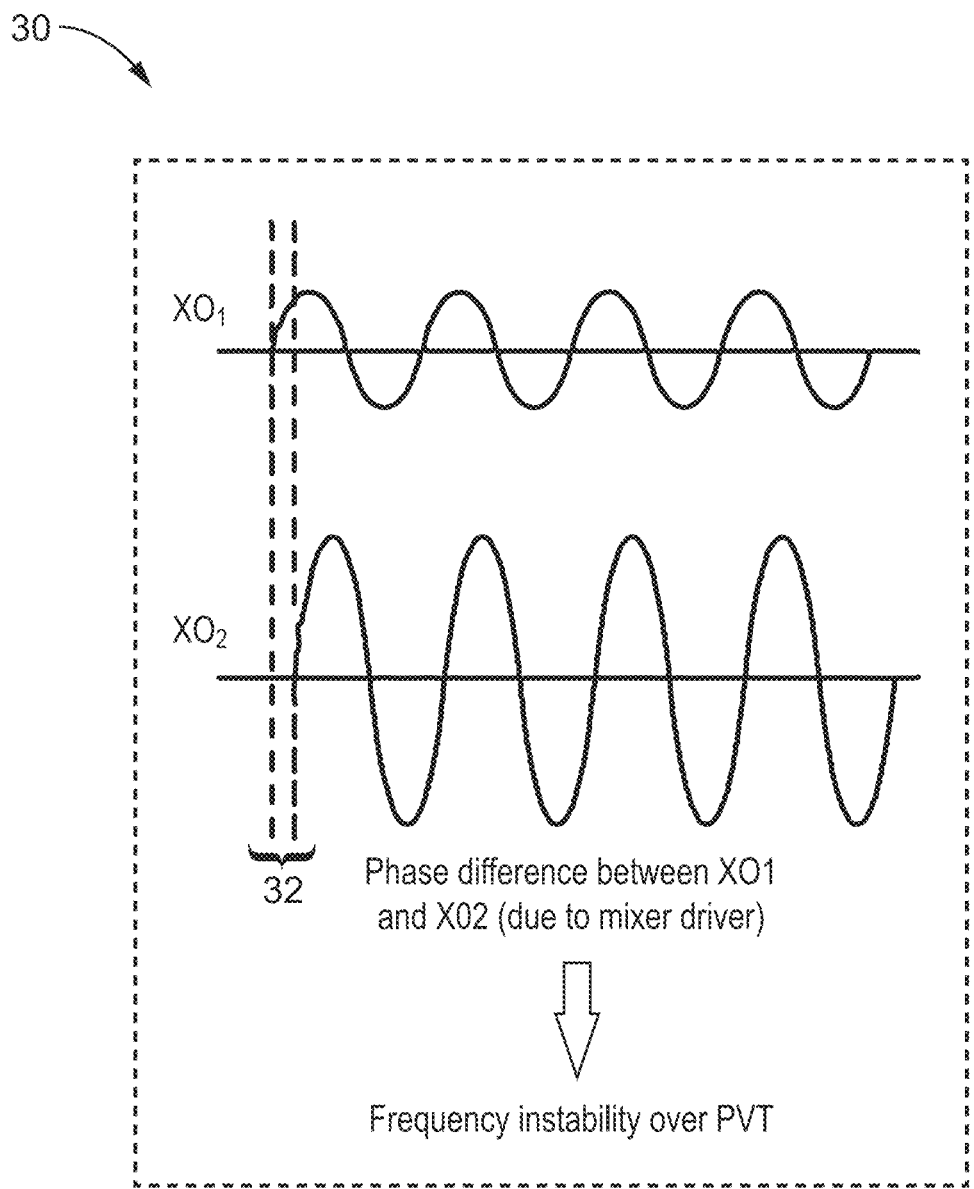

FIG. 2A and FIG. 2B illustrate an example embodiment 10, 30 of the disclosed oscillator, which instead of directly amplifying the oscillation, down-converts the resonator's current to DC, amplifies it at DC, then up-converts the amplified signal back to the oscillation frequency.

By processing the signal at DC, the technique eliminates (side-steps) the minimum transconductance ($g_m$) requirement of a Pierce oscillator: $g_{m,conv.} > \omega_o^2 \cdot C_L^2 \cdot R_m \gg g_{m,required}$, wherein $\omega_o$ is operating frequency in radians/second, $C_L$ is total load capacitance on each side of the resonator, and $R_m$ is the resistive loss of the resonator. It should be noted that a large minimum $g_m$ requirement is an impediment to achieving ultra-low power operation. The ULP oscillator of the present disclosure only requires that the DC amplifier's feedback resistor $R_f$ is of a larger resistance value than the resistive loss of the resonator $R_m$, wherein $R_f > R_m$.

In FIG. 2A the amplifier 10 is shown with an ultra-low power amplifier circuit 12 having amplifier 14 and feedback resistance 16. Amplifier circuit 12 is coupled at its input and output through mixer circuits 18a, 18b to a resonator 22. In this example the resonator is depicted as a crystal 22 having sides XO1 and XO2, depicted as resonating at frequency $\omega_0$. It should be appreciated that a mixer circuit is a passive or active device that can modulate or demodulate a signal. Mixers 18a, 18b are depicted as being controlled (driven) by a mixer driver 20. The signal coming from the resonator is very small, usually not sufficiently large to enable it to drive a passive or active mixer. If no buffer, or other kind of mixer driver is utilized, the mixer would strongly load the resonator. It should also be appreciated that the present disclosure can also be configured for use with other resonator forms, including micro-electromechanical system (MEMS) resonators, ceramic resonators and surface-acoustic-wave (SAW) resonators.

In FIG. 2B is depicted the signals XO1 and XO2 30 across resonator 22, and the associated phase difference 32 resulting from the mixer driver.

In at least one embodiment tested so far, the DC amplifier was shown to have a power consumption as low as 50 pW. Thus, the present disclosure provides an ultra-low power amplifier having a power consumption below 100 pW, and more preferably 50 pW or less. It should be noted that the frequency conversions (to DC and back) can result in a non-zero phase shift across the resonator as was seen in FIG. 2B due to the delay in the mixers' gate-drivers and so forth, which varies over Process, Voltage, and Temperature (PVT), potentially degrading the oscillator's frequency stability.

Figure 3A:
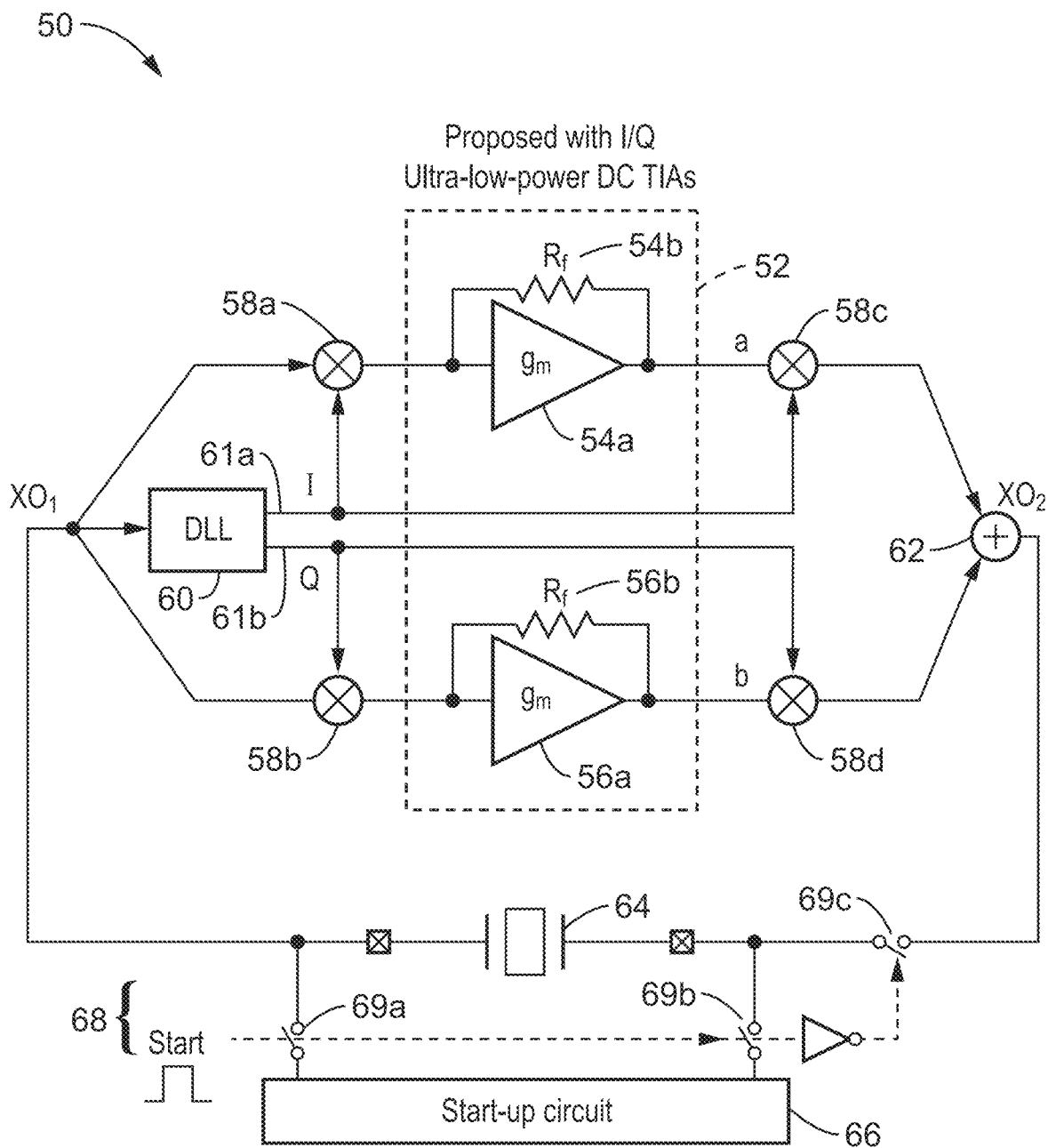
FIG. 3A and FIG. 3B are a circuit block diagram and waveforms of an ultra-low power (ULP) oscillator employing I/Q paths to maintain zero-phase shift according to an embodiment of the present disclosure.
Figure 3B:
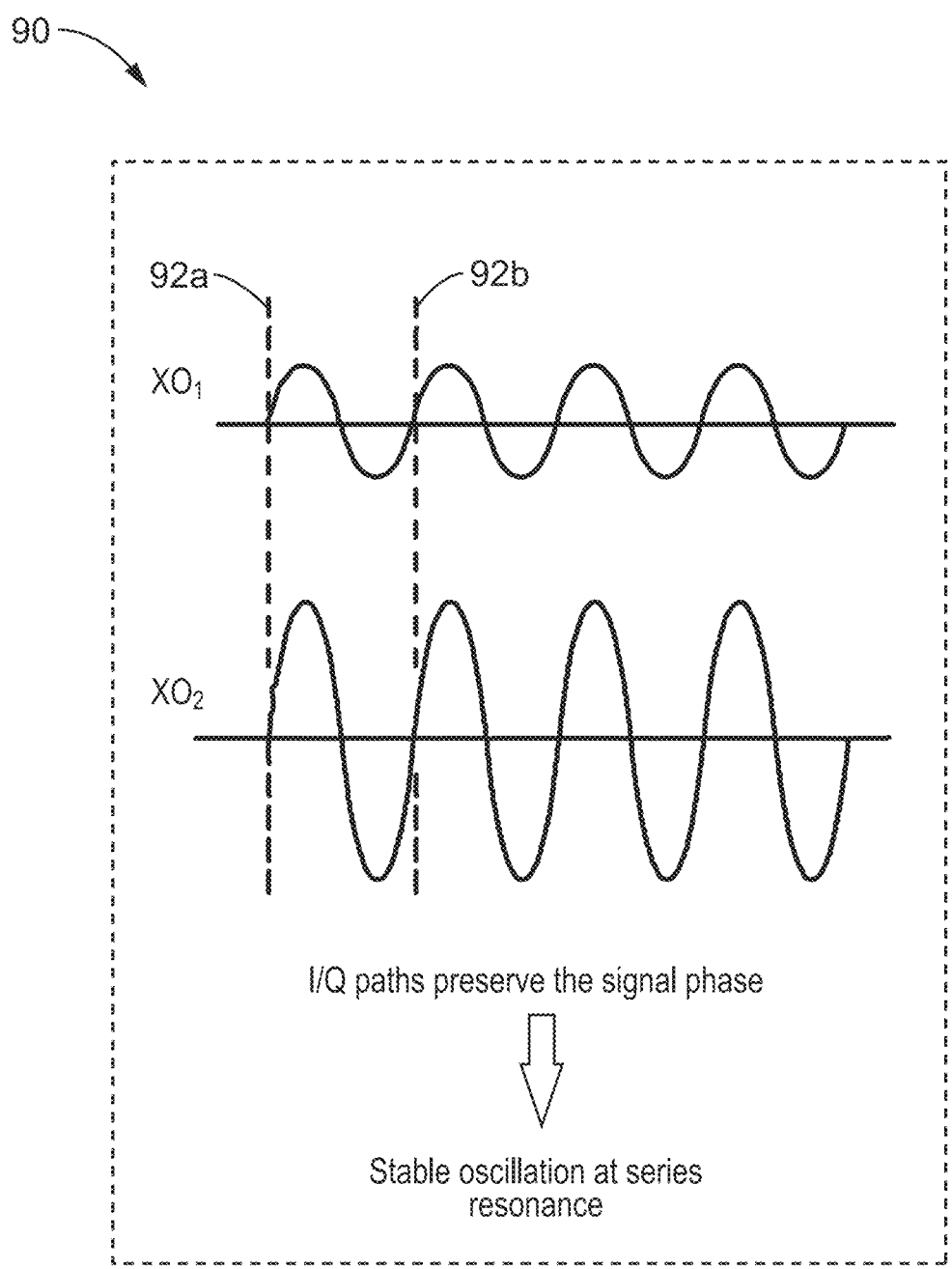

FIG. 3A and FIG. 3B illustrate an example embodiment 50, 90 which incorporate I/Q paths in the frequency conversions (down-conversion and up-conversion) to preserve the phase information and ensure nominally zero phase shift across the resonator. It should be appreciated that the I and Q signals have the same frequency as XO1, and have quadrature phase relation between each other; however, no preferred phase relation is required between I (or Q) and XO1.

By employing I/Q paths to maintain zero-phase shift across the resonator the Barkhausen criteria for oscillation are satisfied. Consequently, by incorporating these I/Q paths, the resonator oscillates at its series-resonance frequency with improved frequency stability even without using large load capacitors.

The example circuit 50 is shown with an amplifier circuit 52 comprising a pair of ultra-low-power, low frequency transimpedance amplifiers (TIAs) 54a, 56a, that along with feedback resistors 54b, 56b, convert DC, or slowly varying current, to voltage. An XO1 signal is split and received by the mixer circuits 58a, 58b, coupled to the inputs of the amplifiers 54a, 56a, whose DC or slowly varying outputs, "a" and "b", are mixed 58c, 58d and summed 62 to output a signal connected to XO2 of resonator 64.

In at least one embodiment a ULP delay-locked loop (DLL) 60 derives binary I/Q signals 61a, 61b, from the oscillation signal. It should be noted that the signals I and Q will nominally be in quadrature phase relation (i.e., 90 degrees apart from each other), but I (or Q) can have an arbitrary phase relation with XO1. In this configuration, any higher order harmonic content resulting from mixing is significantly suppressed by the low-bandwidth DC amplifier and the resonator, especially when utilizing a high-Q resonator such as crystal or micro-electromechanical system (MEMS). It should be appreciated that the above circuit may be implemented using other multiples aside from quadrature.

Since the I/Q signals are unavailable at start-up, a dedicated start-up circuit 66 is utilized. The start up circuit 66 is shown coupled through a switching circuit 68 to resonator 64 by switches 69a, 69b, while another switch 69c is in series with one of the resonator outputs, herein depicted as XO2. During start-up, the DLL and the biasing circuits settle to their steady state to guarantee proper start-up and normal operation. It should be appreciated that different startup circuits can be employed without departing from the teachings of the present disclosure. For instance, a separate Pierce topology could be employed as the startup circuit. Alternatively, an injection oscillator, which is typically a ring oscillator at nominally the same or close to the oscillation frequency, can be utilized for driving the resonator during startup. Other startup circuits can also be utilized without departing from the teachings of the present disclosure.

In FIG. 3B is seen the signals XO1 and the fundamental component of XO2 90 across resonator 64, in which there is no phase difference with the signals shown maintaining alignment, such as seen by the zero crossing positions 92a, 92b.

FIG. 4A through FIG. 4E illustrate an example embodiment 110, 130 of the presented ULP oscillator of FIG. 3A depicting details of at least one implementation at a more detailed level. This embodiment utilizes important mechanisms for performing the down-conversion and up-conversion with reduced power consumption levels.

Four differential output mixers 120 are shown with inputs connected to XO1 and with their other local oscillator (LO) inputs coupled to the I and Q signals from DLL 128. Cross-coupled differential outputs from mixers 120 are connected to differential amplifiers 122, 124, each having variable feedback resistances 121a, 121b, and 123a, 123b, respectively, which are controlled by an amplifier control loop 125 in response to receiving amplifier output voltages V1, V2, V3 and V4. Amplifier outputs V1 through V4 are then respectively switched, as depicted through switches 126a, 126b, 126c and 126d, by signals D1, D2, D3 and D4 which are 25% duty cycle binary signals from what is referred to herein as a 25% generator 129. The four binary signals D1, D2, D3 and D4 127 are all at same frequency of XO1 and with theta, theta+90, theta+180, theta+270 degrees phase relation where theta is arbitrary. The resultant switched amplifier output 127 is seen connected through start up switch 116c to XO2 of resonator 112. Resonator 112 is shown coupled to start up circuit 114 through switches 116a, 116b controlled by a signal 117 from the start up circuit, which is inverted at inverter 116d to drive switch 116c at one of the resonator lines, here depicted at XO2 of resonator 112.

Figure 4A:
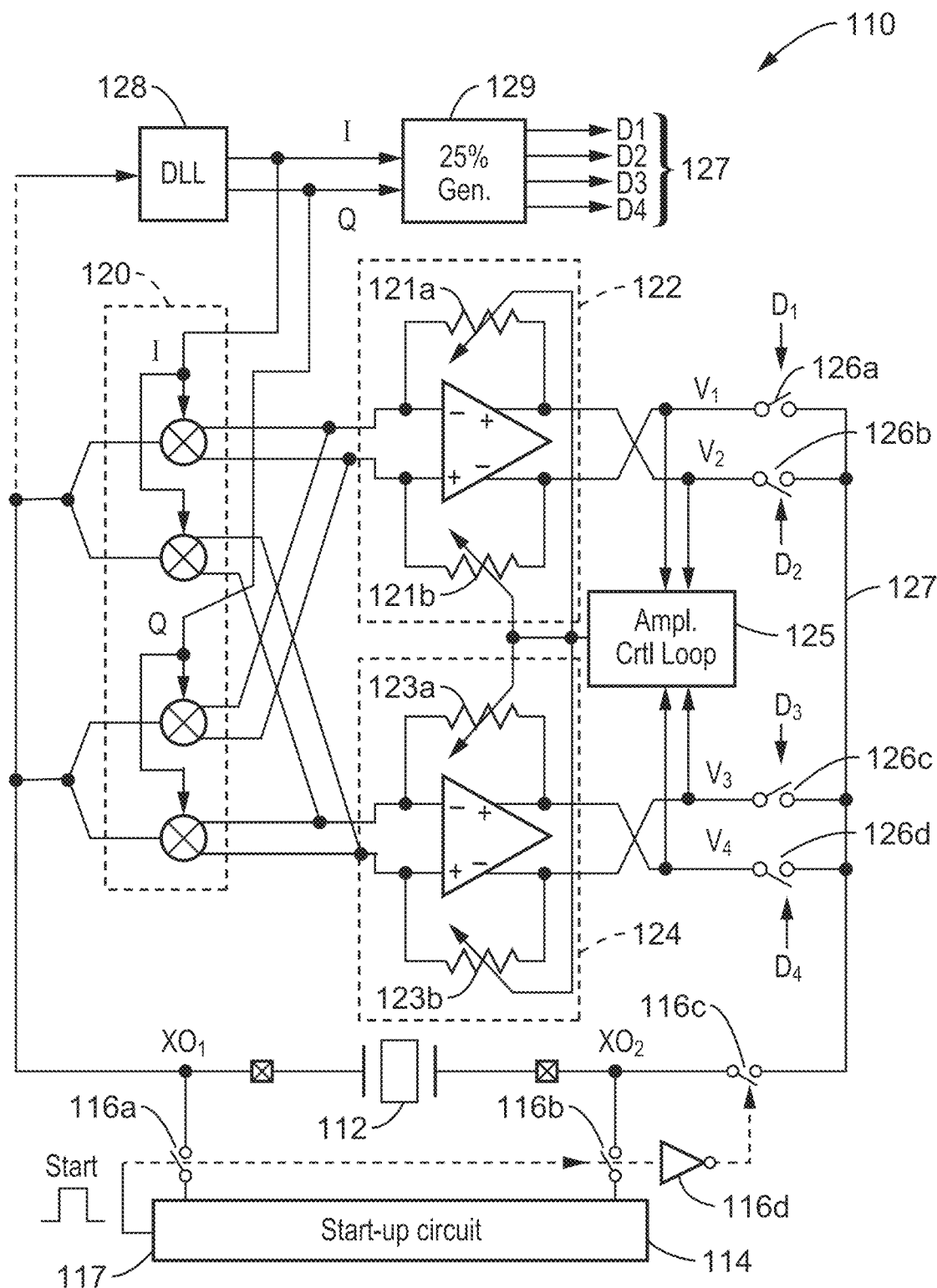
FIG. 4A through FIG. 4E are schematics and waveforms of an implementation example of an ultra-low power (ULP) oscillator employing I/Q paths, as shown in FIG. 3A, that avoids using an explicit I/Q summer driving crystal side XO2 according to an embodiment of the present disclosure.
Figure 4B:
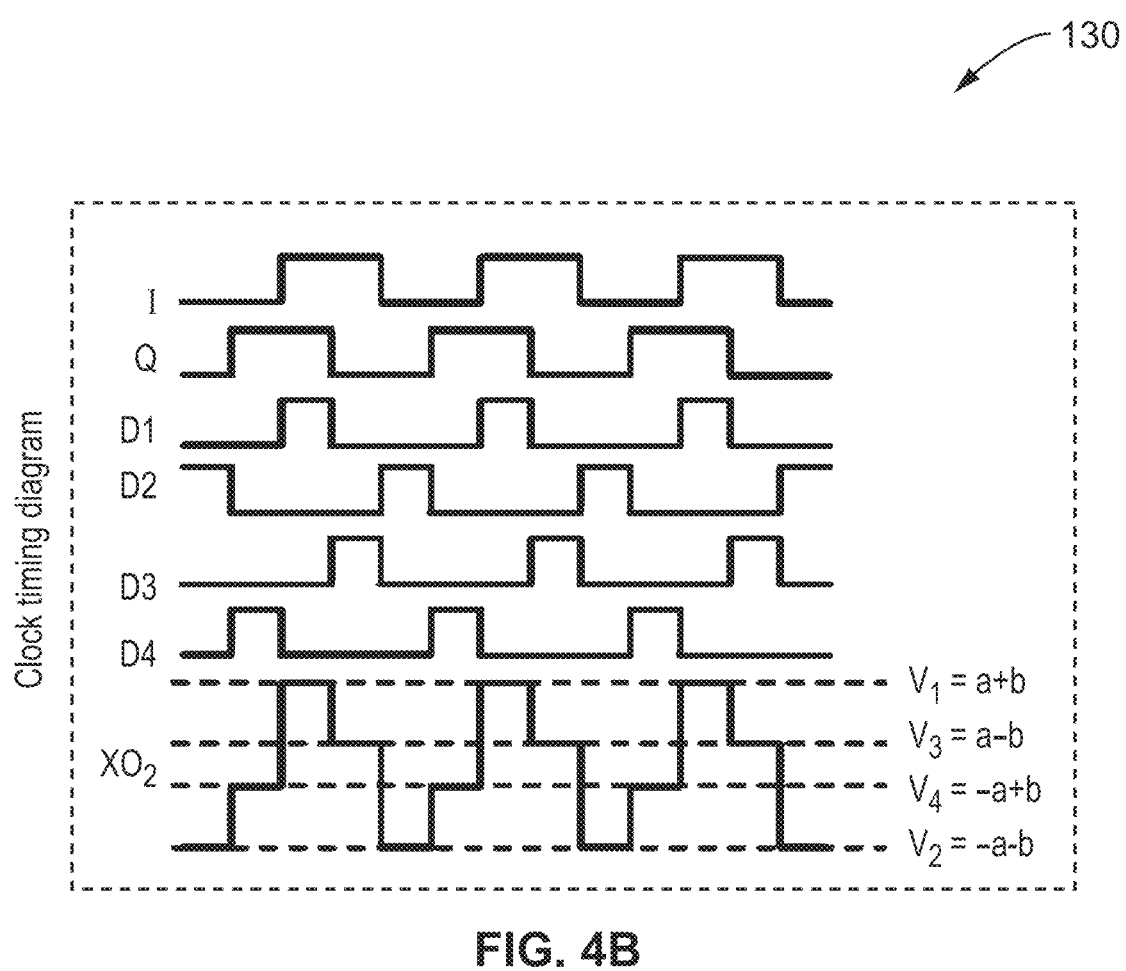

In FIG. 4B is illustrated an example embodiment 130 of digital waveforms of the I and Q signals in relation to D1 through D4 and in relation to XO2 of the resonator.

Figure 4C:
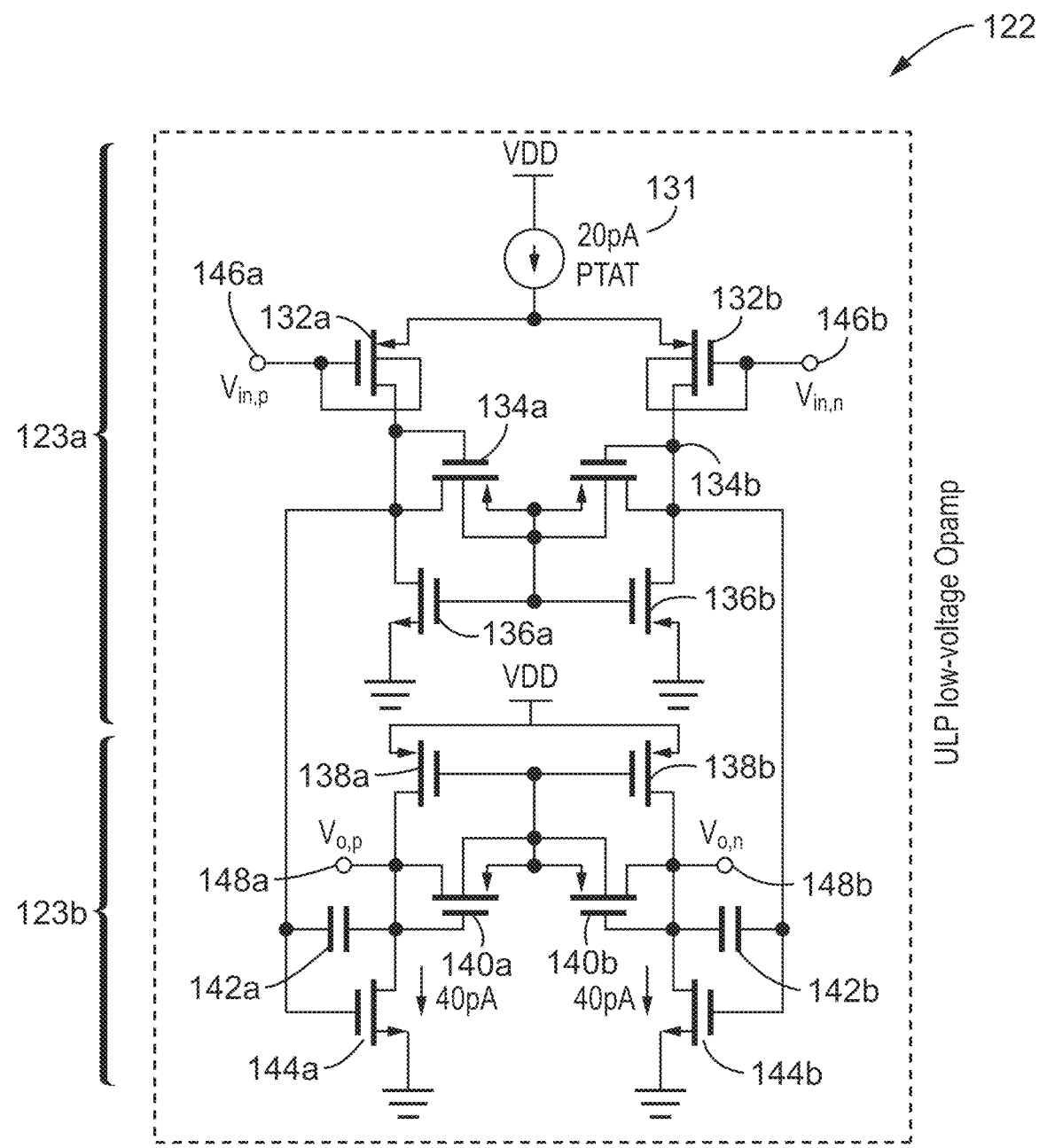

It should be noted that the embodiment described in FIG. 4A through FIG. 4C is an efficient mechanism for implementing the I/Q down-converters and up-converters referred to in FIG. 3A. In particular, this approach avoids the high power consumption adder circuit utilized to generate the signal to drive XO2=a*I+b*Q. This is achieved by generating four DC voltage levels, V1, V2, V3, and V4 corresponding to the values (±a ±b), and then switching between them to crudely approximate a sine-wave at the same frequency as XO1, as illustrated in FIG. 4B. It is important to note that the resonator suppresses high frequency content in such a 4-level signal leaving the fundamental to match XO2=a*I+b*Q described in FIG. 3A. By way of example and not limitation, switching between V1 through V4 is performed using non-overlapping 25% duty cycle signals, D1 through D4, as shown in the timing diagram. By way of example and not limitation, ignoring the output common-mode voltage of the transimpedance amplifiers (TIAs) for the sake of simplicity of illustration, the voltage levels (a+b) and (a−b) are being generated by down-converting XO1 using (I+Q) and (I−Q) instead of I and Q, respectively; accordingly, the voltage levels (−a−b) and (−a+b) are generated simply by using differential mixers for down-converting XO1 using (I+Q) and (I−Q) and tapping their negative outputs.

In one embodiment this is achieved using additional passive current commutating mixers feeding directly into the DC TIAs. The other voltage levels (−a−b) and (−a+b) are available simply from using differential TIAs. In at least one embodiment, the mixers, four of which are used in this example, can be passive mixers such as implemented using transmission gates. Oscillation amplitude control is achieved by the Amplitude Control Loop by comparing max(V1 through V4) with a reference voltage and adjusting the TIAs' feedback resistance accordingly, as shown. It should be appreciated that the common mode of V1, V2, V3, and V4 is ignored in the above description. In a practical setting, in at least one embodiment, max(V1, V2, V3, V4)−$V_{cm}$ is compared with a reference voltage, in which case the reference voltage sets the oscillation amplitude. Computation of max(V1 through V4) is achieved using low switching activity voltage comparators and consumes negligible power; details are omitted here for the sake of brevity.

In FIG. 4C is illustrated an example embodiment 122 of a TIA using a low-voltage, ULP two-stage 123a, 123b, operational amplifier which receives differential inputs 146a, 146b, and generates differential outputs 148a, 148b. In at least one embodiment the two-stage operational amplifier (op-amp) is configured to operate at low supply voltages, such as 0.5V, the figure depicts power supplied between $V_{DD}$ and Ground.

Special features are employed in this TIA embodiment, including the following. The body of the PMOS transistors is connected to the gate to reduce threshold voltage. The transistors 134a and 134b, and similarly 140a and 140b in the second stage, are pseudo-resistors used to set a preferred stage output common mode voltage.

It should be appreciated that other op-amp circuits may be utilized without departing from the teachings of the present disclosure especially when targeting other supply voltages and/or power consumption targets.

Each of the disclosed operational amplifiers consumes only 50 pW and is biased by a proportional-to-absolute-temperature (PTAT) current source 131 to ensure a constant transconductance over temperature. A first stage 123a is shown with differential inputs 146a, 146b at the gate of input transistors 132a, 132b which are part of a PMOS differential amplifier with an NMOS load with transistors 136a, 136b, and intermediate transistors 134a, 134b. Output from the first stage is received at a second stage which comprises a tail-less NMOS differential amplifier having NMOS transistors 138a, 138b,with active PMOS loads 144a, 144b. Capacitors 142a, 142b are for compensation of the two stage amplifier for improving its stability. The present disclosure may utilize other mechanisms for controlling oscillation amplitude without departing from the teachings of the present disclosure. Furthermore, it should be appreciated that one of the primary objects of this embodiment are to provide for operation at low power and low supply voltage, while other circuits and configurations may be utilized to fulfill these objects according to the described operating principles and without departing from the teachings of the present disclosure.

Figure 4D:
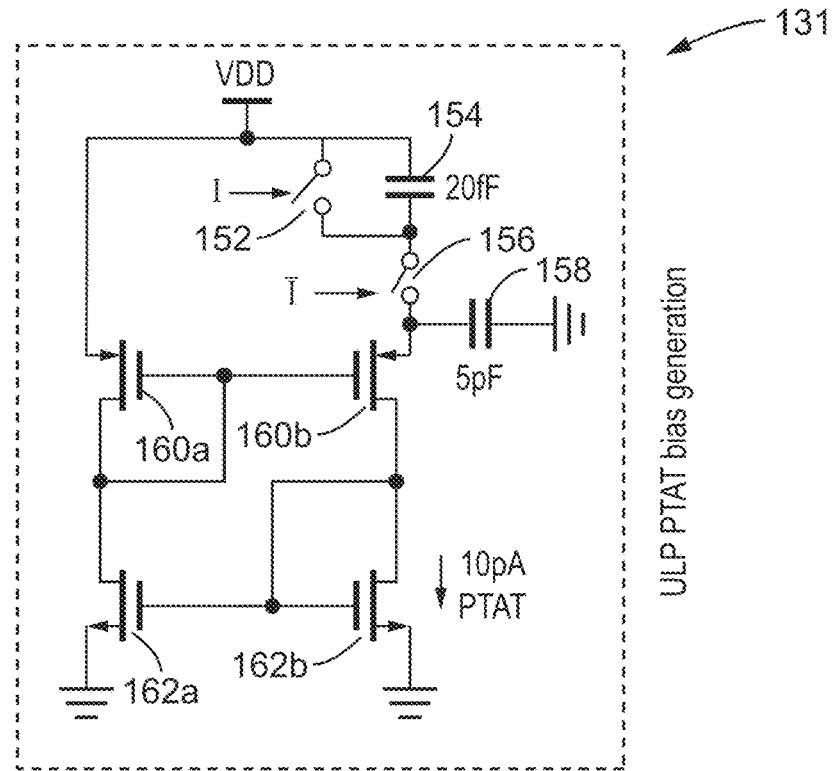

In FIG. 4D is illustrated an example embodiment 131 of the ultra-low power, PTAT bias current generation utilizing a switched-capacitor technique, whose block diagram was seen in FIG. 4C as block 131. A capacitor 154, exemplified as 20 femtoF (fF), is coupled to $V_{DD}$ and shorted by switch 152, and having an output coupled through switch 156 connected to shunt capacitor 158, exemplified as 5 pF, coupling to the source of MOSFET transistor 160b. MOSFET transistor 160b shares a gate with its counterpart 160a, each of which has its drain coupled respectively to the drains of MOSFET transistors 162a, 162b, with a cross-coupling of the respective gate to either leg of the totem pole of transistors. The switches 152, 156 are clocked by the oscillation signal, with the PTAT circuit generating currents as low as 10 pA without requiring any off-chip components.

It should be noted that the circuit in FIG. 4D is a switched capacitor PTAT bias current generator that differs from conventional PTAT bias current generators in that the combination of switches 152, 156, controlled by signals I and $\bar{I}$, and the capacitors 154, 158 form a switched capacitor resistor. In contrast, a conventional PTAT bias current generator replaces the combination with a simple resistor from $V_{DD}$ to the source of 160b. The switched capacitor resistor combination provides a very large resistor in the GigaOhm range which is very difficult to accurately implement using actual fixed resistors or MOSFETs.

It should also be appreciated that other forms of PTAT bias current generator circuits may be utilized without departing from the present disclosure.

Figure 4E:
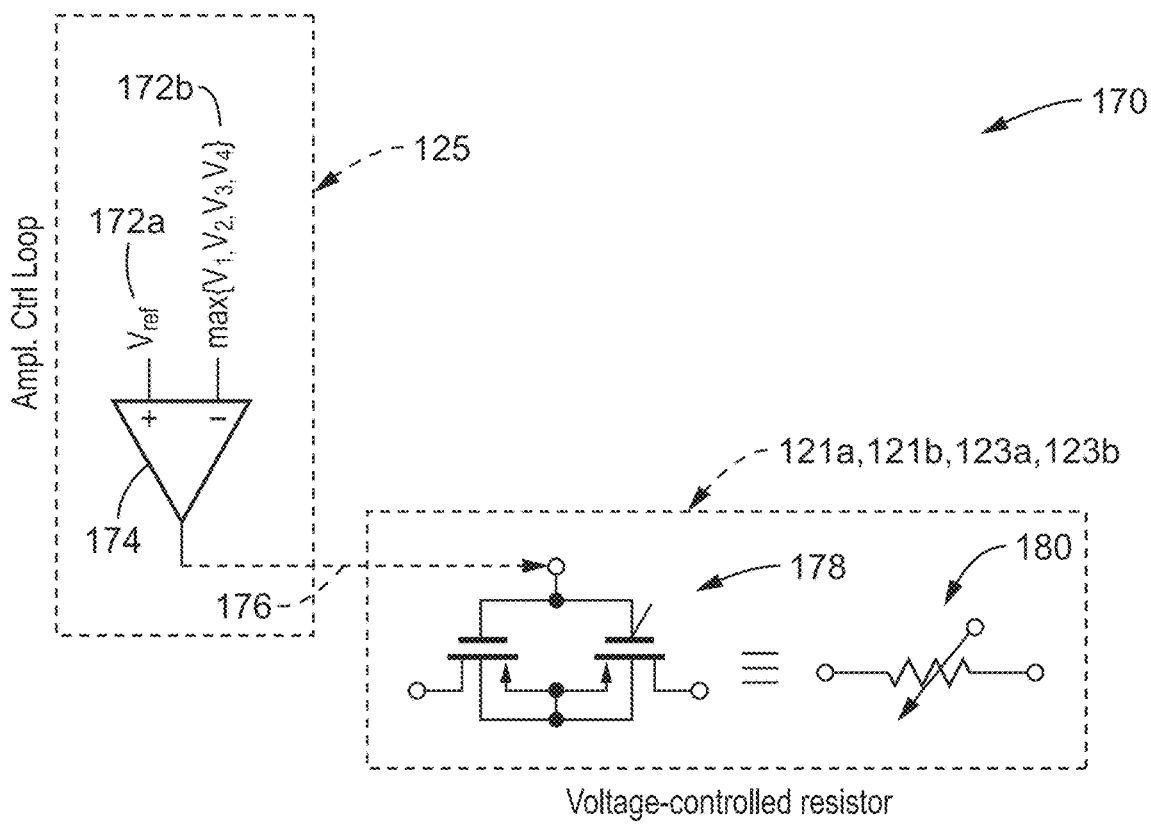

FIG. 4E illustrates an example embodiment 170 of the amplifier control loop and voltage-controlled resistances utilized as the feedback resistors of the TIAs. A portion of the amplifier control loop circuit 125 is shown having a comparator 174 with inputs Vref 172a and max$\{V_1, V_2, V_3, V_4\}$ 172b to generate output 176 for controlling one of the variable feedback resistances 121a, 121b, 123a, 123b. In at least one embodiment this variable resistance 180 can comprise a transistor circuit 178, such as using MOSFET transistors, exemplified here as a back-to-back coupled MOSFET arrangement having a connection between the bulk and source connections of the two devices. It should be appreciated that other variable resistance circuits can be utilized in the present invention without limitation.

Figure 5A:
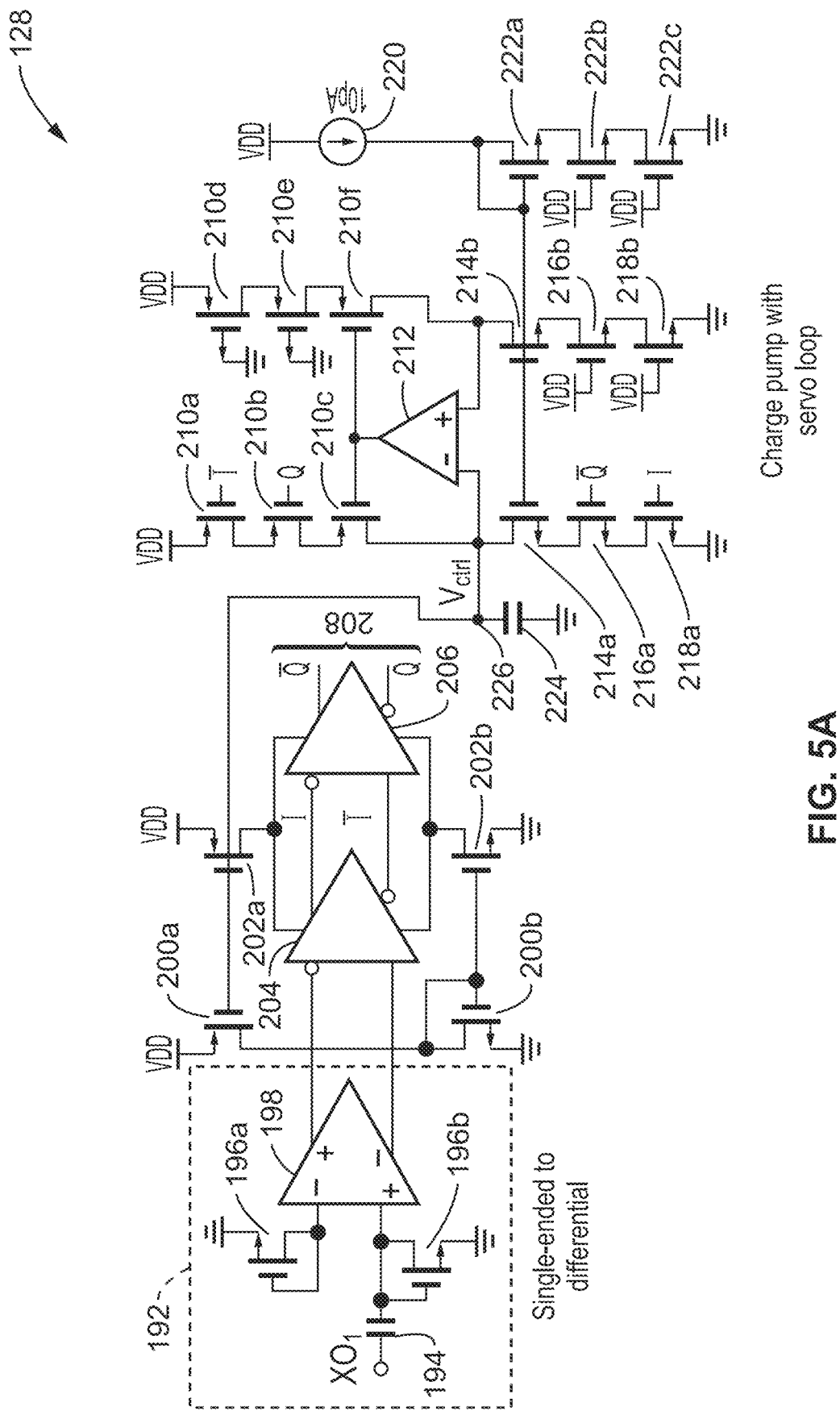
FIG. 5A through FIG. 5D are schematics and a start up plot for a delay-locked loop of the circuit shown in FIG. 4A for generating the I/Q signals from the oscillation signal according to an embodiment of the present disclosure.
Figure 5B:
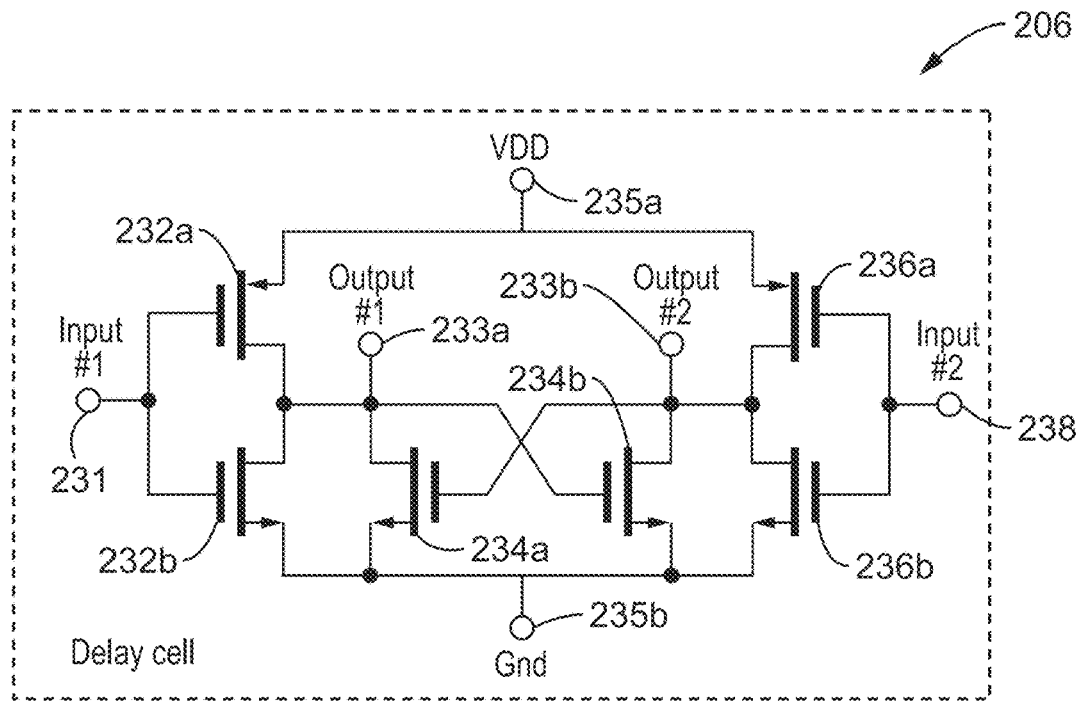
Figure 5C:
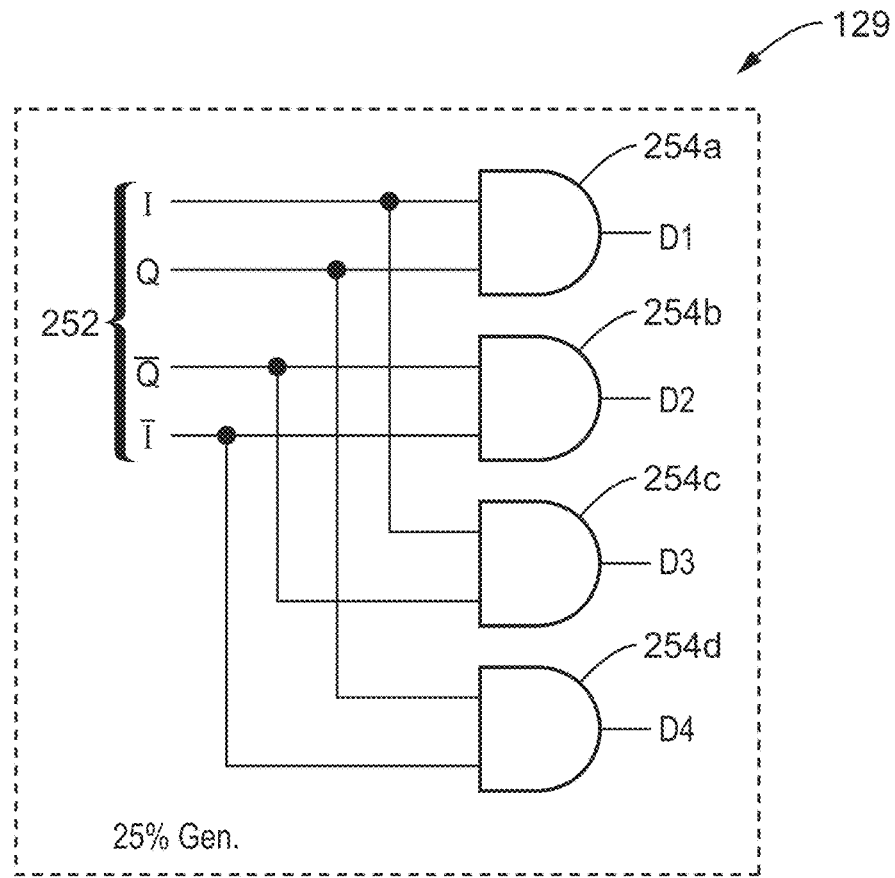

FIG. 5A through FIG. 5C illustrate an example embodiment 128, 206, 129 of circuits for the DLL implementation. In FIG. 5A is shown the DLL circuit having a differential converter 192 that is shown receiving oscillator signal XO1 through capacitor 194 first converted to a differential signal by a single ended to differential output amplifier 198. P-channel MOSFETs 196a, 196b are coupled to ground at the positive and negative inputs of the amplifier to provide appropriate bias.

Differential output from converter 192 is input to a two-stage current-controlled delay line, having a first delay 204 that generates the I and $\bar{I}$ signals and a second delay 206 that generates the Q and $\bar{Q}$ signals, both of which are at the same frequency as the oscillator signal XO1. Thus, the circuit is shown generating I, $\bar{I}$, Q and $\bar{Q}$ signals 208.

The delay of each of the stages of this two stage delay line, and hence, the delay and phase between I and Q signals is controlled by the signal $V_{ctrl}$ 226, in response to adjusting the bias currents through each stage of the delay line through the combination of transistors 200a, 200b, 202a and 202b. The signal $V_{ctrl}$ is set by a charge pump composed of sourcing pump 210a, 210b, 210c and a sinking pump 214a, 216a, 218a. These pumps pull $V_{ctrl}$ up or down in negative feedback, according to the relative phase difference between I and Q, as well as their complementary signals. The signal $V_{ctrl}$ is automatically adjusted until the delay in the second delay 206 is exactly equal to ¼th of the period of the oscillator input XO1, such as until I and Q are in quadrature. The capacitor 224 stabilizes the resultant servo loop. It should be noted that usually XO1 has very close to a 50% duty cycle owing to the high-Q resonator; accordingly, I and Q also have close to 50% duty cycle, and are in quadrature.

The sinking charge pump is biased by the 10 pA current source 220 and the NMOS current mirror transistor 222a and replica NMOS transistors 222b and 222c. The sourcing charge pump is in turn biased by the amplifier 212 and the replica charge pump 210d, 210e, 210f and 214b, 216b, 218b.

In FIG. 5B is illustrated an example embodiment 206 of a differential delay cell with inputs 231 and 238, outputs 233a, 233b, and power applied between $V_{DD}$ 235a and ground 235b. Transistors 232a, 232b, and 236a, 236b realize two inverters weakly cross-coupled by transistors 234a, 234b to realize a differential delay cell. Sourcing current entering 235a and sinking current leaving 235b determine the delay of each stage.

In FIG. 5C is illustrated an example embodiment 129 of the 25% generation circuit for controlling output switching of the differential amplifiers. Inputs I, Ī, Q, Q̄ 252 are received at inputs of four AND gates 254a, 254b, 254c, and 254d. Specifically, the I signal is received at inputs to gates 254a and 254c, the Q signal received at inputs to gates 254a and 254d, the Q̄ signal is received at inputs to gates 254b and 254c, while the Ī signal is received at an input to gate 254b and to 254d. This cross coupling of I, Ī, Q, Q̄ to these gates results in the digital outputs D1, D2, D3 and D4 which are seen in FIG. 4B.

Figure 5D:
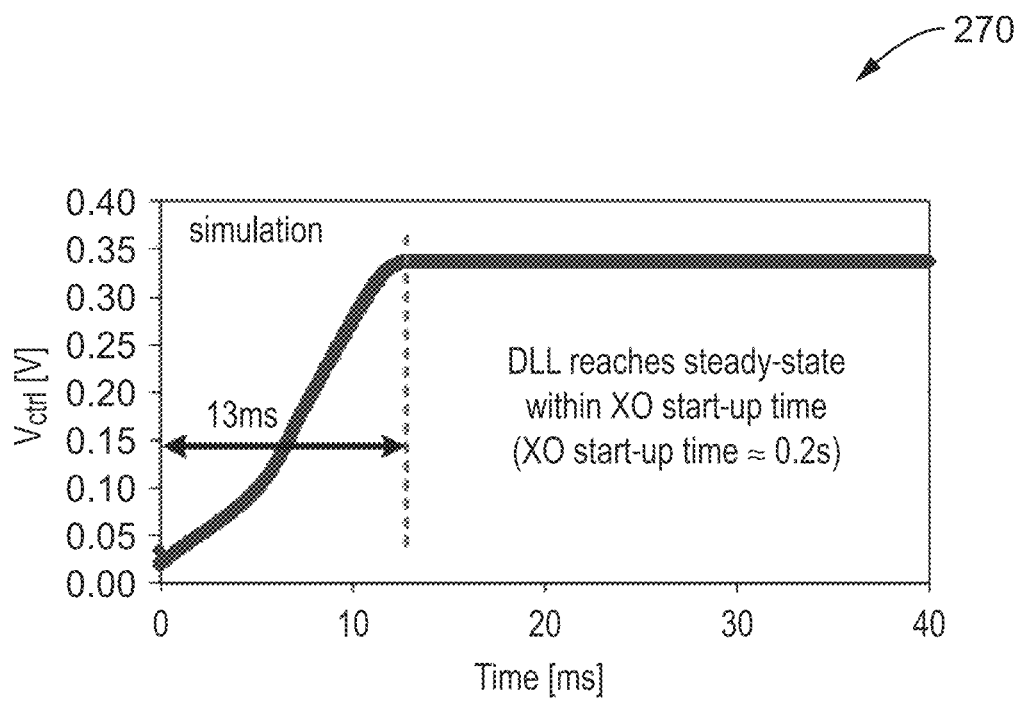

In FIG. 5D is illustrated an example embodiment 270 of a simulated transient response of the DLL (for the case of a 13 KHz XO), which shows that the DLL settles to its steady-state in 13 ms, which is well within resonator (XO) start-up time of 0.2 s.

Figure 6:
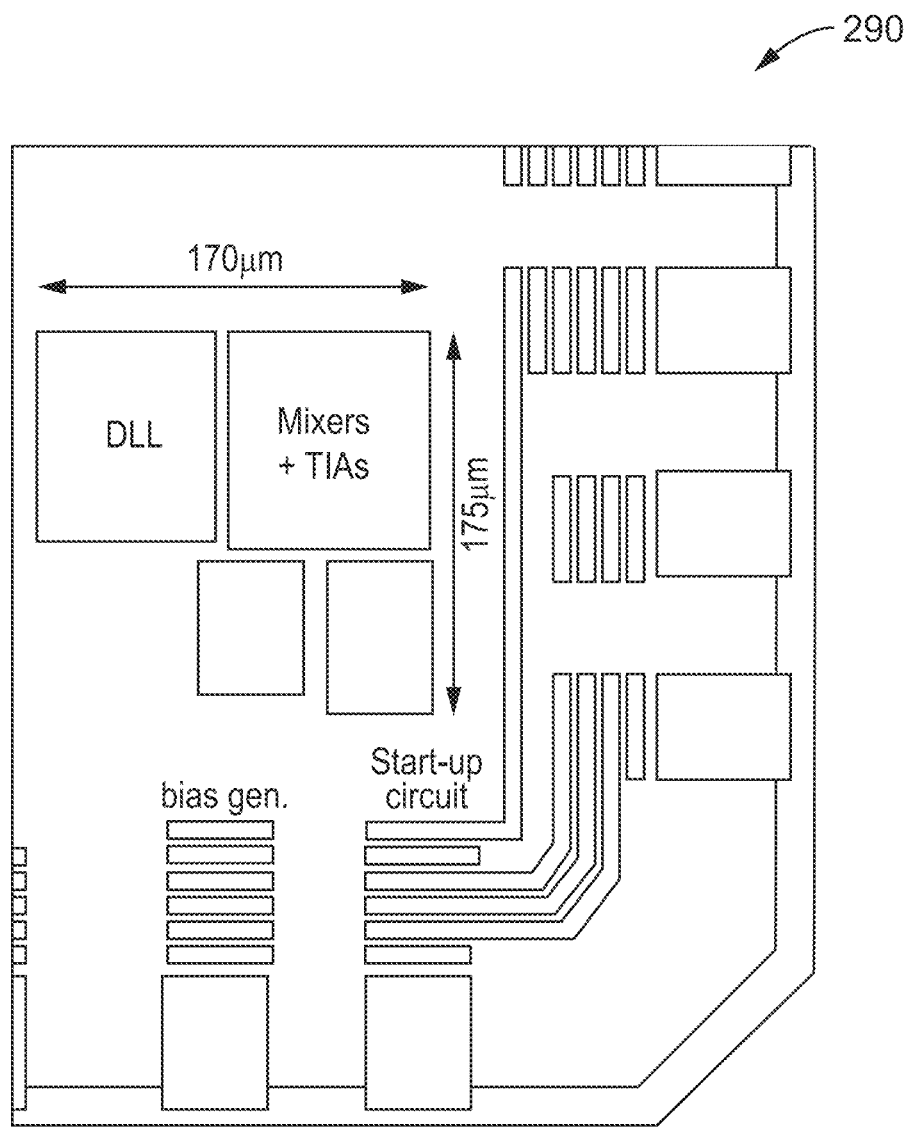
FIG. 6 is a rendition of a portion of a die micrograph containing an ultra-low power (ULP) oscillator fabricated according to an embodiment of the present disclosure.

FIG. 6 illustrates an example embodiment 290 in which a proof-of-concept prototype integrated circuit (IC) was fabricated in TSMC (a specific manufacturing process of Taiwan Semiconductor Manufacturing Company®) 65 nm CMOS technology with an active area of 0.027 mm² for a 32 KHz XO. The areas are shown at a corner of the die depicting the regions for the DLL, Mixers and TIAs, start-up circuit and bias generation.

Figure 7A:
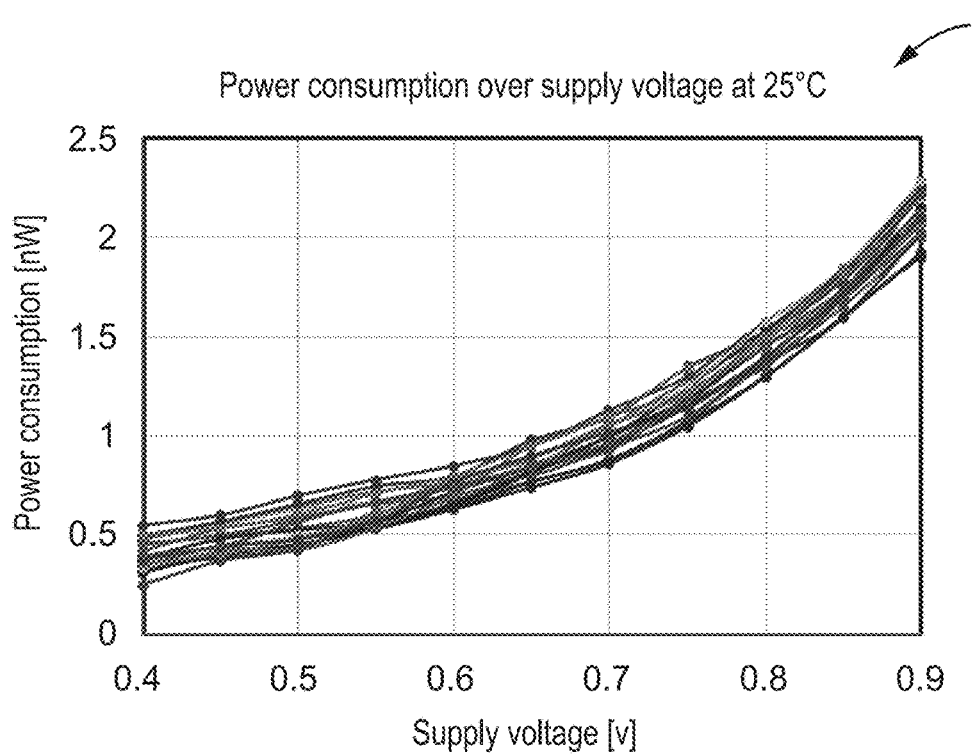
FIG. 7A through FIG. 7D are plots of measurement of power consumption and frequency variations with respect to frequency and temperature variations for the ULP oscillator circuit of FIG. 6 fabricated according to an embodiment of the present disclosure.
Figure 7B:
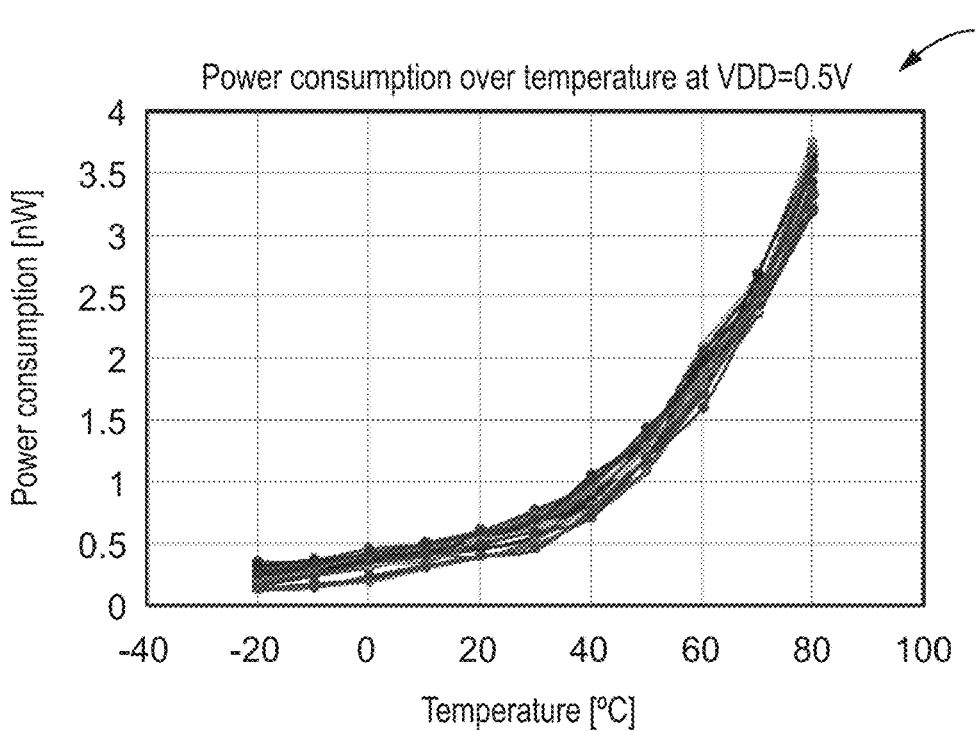
Figure 7C:
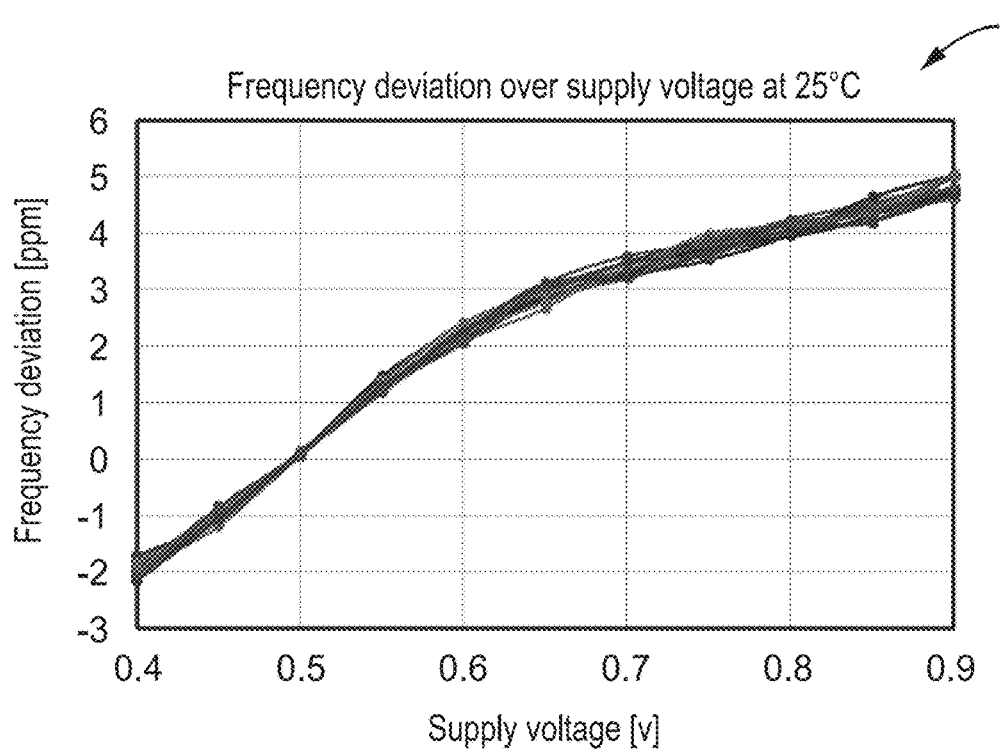
Figure 7D:
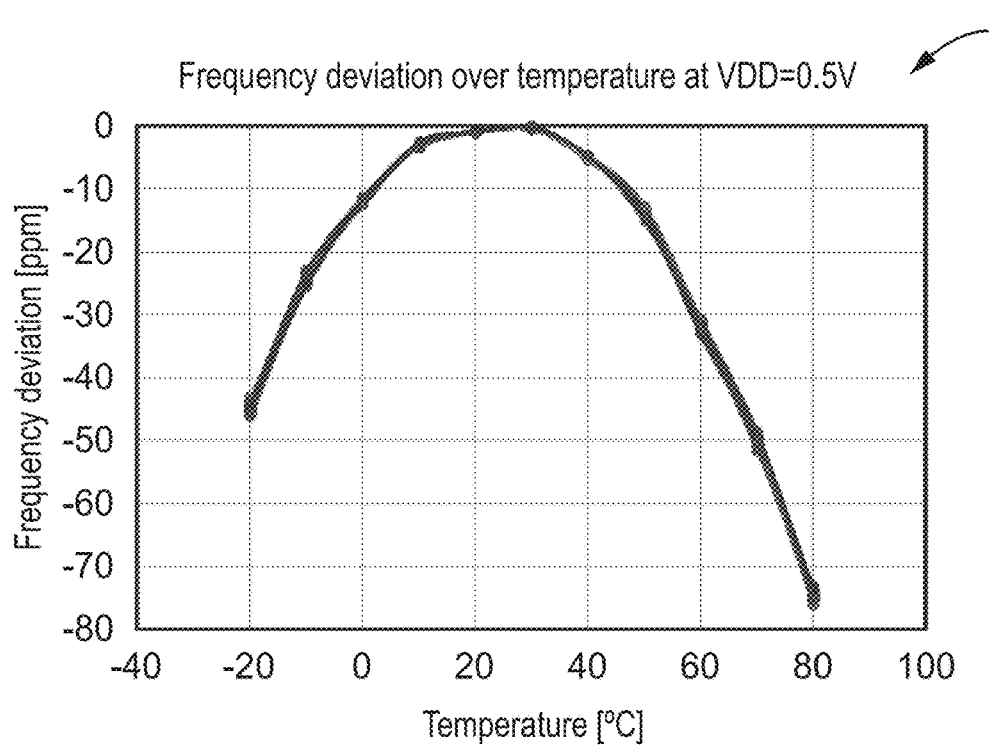

FIG. 7A through FIG. 7D illustrate example embodiments 310, 330, 350, 370 of measured power consumption and frequency variation of the above example embodiment of the ULP XO. The measurements are shown under supply voltage variations from 0.4V to 0.9V (at 25° C.) in FIG. 7A, and temperature variations in FIG. 7B from −20° C. to 80° C. (at VDD=0.5V). The measurements were performed across 20 different chips. As seen, the proposed XO consumes 0.55 nW from a 0.5V supply at 25° C. (averaged across 20 chips with a worst-case power of 0.7 nW). Measured frequency variation is within 80 ppm across temperature as seen in FIG. 7D, and with an average line sensitivity of approximately 13 ppm/V as seen in FIG. 7C.

Figure 8A:
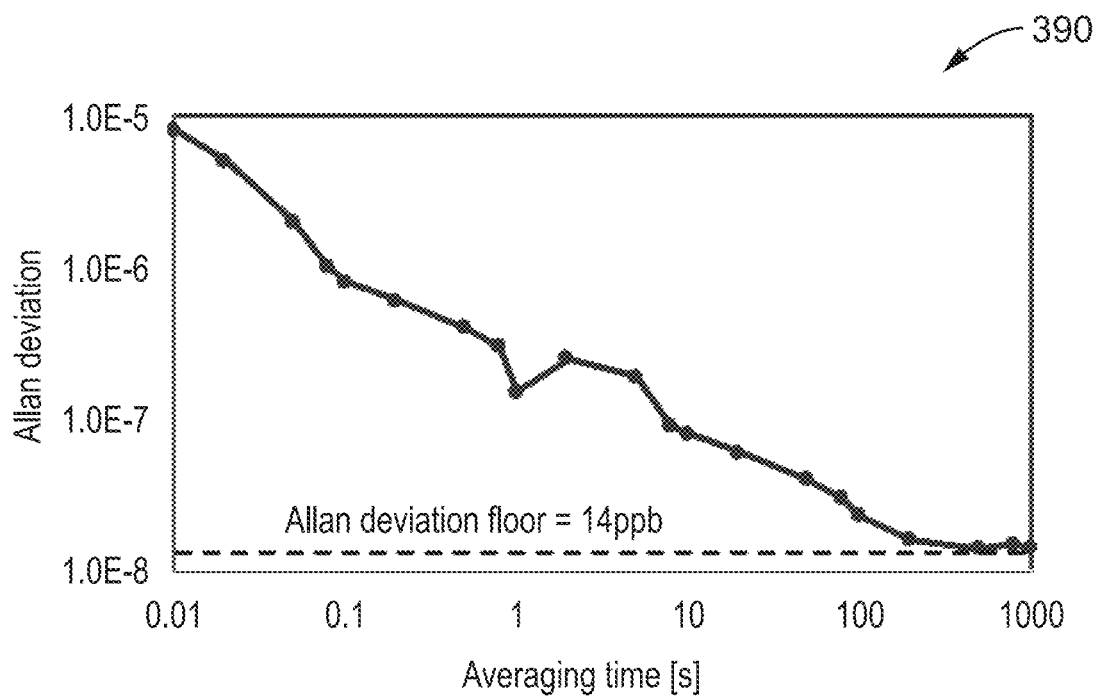
FIG. 8A and FIG. 8B are plots of measured Allan deviation for the ULP oscillator circuit of FIG. 6 fabricated according to an embodiment of the present disclosure.

FIG. 8A illustrates a plot 390 of measured Allan deviation, showing a measured Allan floor indicating that the long-term frequency stability is better than 14 ppb.

To verify the robustness of the proposed XO to mismatches between the I/Q paths, intentional errors were introduced between I and Q phases using an external clock generator.

Figure 8B:
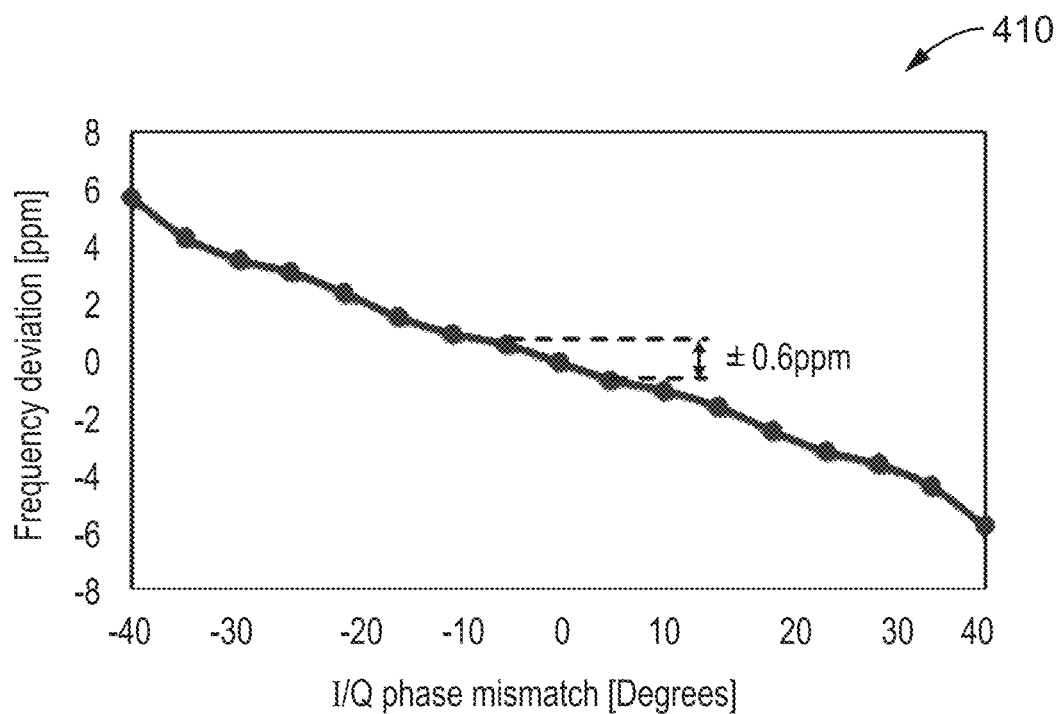

FIG. 8B illustrates a plot 410 of deviation of the oscillation frequency as a result of the intentional I/Q phase mismatch (from 90°). The frequency deviation is minimal (±0.6 ppm within ±5°), as the high-Q resonator only has to be slightly pulled off resonance to compensate for the phase mismatch.

A summary of the power consumption for this implementation are DLL 29.1%, mixer drivers 25.5%, duty cycle clock generator 22.7%, TIA 14.2% amplifier control loop 5.0% and PTAT bias generation 3.5%.

Table 1 shows how the performance of the disclosed XO compares with other state-of-the-art 32 KHz XOs. Unlike a Pierce XO where the amplifier consumes greater than 85% of the power, the DC op-amps in the disclosed XO only contribute only about 14%. The majority of the power consumption is in the DLL, mixer drivers, and the 25% duty cycle clock generator is composed of mostly digital circuitry and scales well with CMOS technology. As can be seen, the disclosed XO only consumes 0.55 nW, which is about 2.7× lower than the best case found in the state of the art. Also, the presented architecture does not require calibration and multiple supplies, unlike most conventional approaches.

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula(e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that the present disclosure encompasses multiple embodiments which include, but are not limited to, the following:

1. An oscillator apparatus, comprising: (a) a resonator configured for oscillating and generating resonator current at an oscillation frequency; (b) at least one down-converter coupled to a first side of said resonator, said at least one down-converter configured for converting resonator current into direct current (DC); (c) at least one direct current (DC) amplifier circuit, having at least one feedback resistance between its input and output, wherein said direct current (DC) amplifier circuit is configured for amplifying the DC current into an amplified DC signal; (d) wherein said feedback resistor of the direct current (DC) amplifier circuit has a resistance that exceeds the resistive loss of said resonator; and (e) at least one up-converter coupled to a second side of said resonator; (f) wherein said at least one up-converter is configured for up-converting the amplified signal back into an oscillation frequency to output an oscillation signal.

2. An oscillator apparatus, comprising: (a) a resonator configured for oscillating and generating resonator current at an oscillation; (b) at least two down-converters configured for converting resonator current into direct current (DC); (c) at least two up-converters; (d) at least two direct current (DC) amplifier circuits, each having at least one feedback resistance between its input and output, wherein said at least two direct current (DC) amplifier circuits are configured for amplifying the DC current into an amplified DC signal; (e) wherein said feedback resistance of the direct current (DC) amplifier circuit has a resistance that exceeds the resistive loss of said resonator; (f) wherein said at least two down-converters, said at least two up-converters, said at least two direct current (DC) amplifier circuits are configured to provide two I/Q frequency conversion paths comprising an I path and a Q path, that preserve phase information and ensure a nominal zero phase shift across the resonator; (g) a delay-locked loop (DLL) circuit configured for deriving binary I/Q signals from an oscillation signal, and suppressing any higher order harmonic content arising from mixing by said at least two direct current (DC) amplifier circuits, which are low-bandwidth, and said resonator; and (h) a start-up circuit configured for starting said resonator into oscillations before the I/Q signals are available; (i) wherein said at least two up-converters are configured for up-converting the amplified signal back to into an oscillation frequency to output an oscillation signal.

3. A method of generating electrical oscillations, comprising: (a) down-converting a signal from a first side of a resonator which is configured for oscillating at an oscillation frequency, wherein said down-converting converts resonator current into direct current (DC); (b) performing direct current (DC) amplification controlled by feedback resistance in generating DC an amplified DC signal; (c) wherein said feedback resistance exceeds resistive loss of the resonator; and (d) up-converting a signal to a second side of the resonator back into an oscillation frequency.

4. The apparatus or method of any preceding embodiment, wherein said at least one down-converter and said at least one up-converter comprise mixers.

5. The apparatus or method of any preceding embodiment, wherein said resonator is selected from the group consisting of a crystal, an oscillator, a high-Q oscillator, a crystal oscillator, a Pierce crystal oscillator, a reference oscillator, a low-frequency oscillator, a high-frequency oscillator, a MEMS resonator, a resistor-inductor-capacitor (RLC) resonator, and a clock generator.

6. The apparatus or method of any preceding embodiment, wherein said apparatus operates without a minimum transconductance ($g_m$) requirement of a Pierce oscillator $g_{m,conv.} > \omega_o^2 \cdot C_L^2 \cdot R_m >> g_{m,required}$, wherein $\omega_o$ is operating frequency in radians/second, $C_L$ is total load capacitance and only requires that the DC amplifier's feedback resistor $R_f$ is of a larger resistance value than the resistive loss of the resonator $R_m$, wherein $R_f > R_m$.

7. The apparatus or method of any preceding embodiment, wherein said apparatus comprises two down-converters, two up-converters and two direct current (DC) amplifier circuits, which configure the apparatus with frequency conversion I/Q paths that preserve phase information and ensure a nominal zero phase shift across the resonator.

8. The apparatus or method of any preceding embodiment, wherein said I/Q down-converter is implemented using I/Q mixers which are coupled to the DC amplifier circuits and driven by a delay-locked loop (DLL) configured for deriving binary I/Q signals from said oscillation signal, and suppressing any higher order harmonic content arising from mixing by said at least one direct current (DC) amplifier circuit, which is low-bandwidth, and said resonator which has a high-Q.

9. The apparatus or method of any preceding embodiment, wherein said I/Q up-converter comprises a switching circuit.

10. The apparatus or method of any preceding embodiment, wherein said switching circuit is configured to generate four binary signals, which are all at XO1 frequency, with angles theta, theta+90, theta+180, theta+270 degrees phase relation where angle theta is arbitrary, which eliminates any need of a high power consumption summing circuit to drive the resonator.

11. The apparatus or method of any preceding embodiment, wherein said at least one direct current (DC) amplifier circuit comprises at least two direct current differential (DC) amplifiers whose differential outputs are directed to a switching circuit; and further comprising a delay-locked loop (DLL) which converts a signal at said first side of said resonator to a differential signal which is fed to a two-stage current-controlled delay line which is controlled by a charge pump whereby it generates quadrature outputs for controlling said switching circuit; wherein said output oscillation signal is generated in response to switching between four DC voltage levels by a switching circuit controlled by said delay-locked loop (DLL).

12. The apparatus or method of any preceding embodiment, further comprising a start-up circuit to initiate resonator oscillation before the I/Q signals are available.

13. The apparatus or method of any preceding embodiment, wherein said resonator is selected from the group consisting of a crystal, an oscillator, a high-Q oscillator, a crystal oscillator, a Pierce crystal oscillator, a reference oscillator, a low-frequency oscillator, a high-frequency oscillator, a MEMS resonator, a resistor-inductor-capacitor (RLC) resonator, and a clock generator.

14. The apparatus or method of any preceding embodiment, wherein said apparatus operates without a minimum transconductance ($g_m$) requirement of a Pierce oscillator $g_{m,conv.} > \omega_o^2 \cdot C_L^2 \cdot R_m >> g_{m,required}$, wherein $\omega_o$ is operating frequency in radians/second, $C_L$ is total load capacitance and only requires that the DC amplifier's feedback resistor $R_f$ is of a larger resistance value than the resistive loss of the resonator $R_m$, wherein $R_f > R_m$.

15. The apparatus or method of any preceding embodiment, wherein said at least two direct current (DC) amplifier circuits comprise differential amplifiers, each having feedback resistance between each differential input and respective differential output.

16. The apparatus or method of any preceding embodiment, further comprising a switching circuit coupled to receive output from said differential amplifiers and couple it to the resonator output.

17. The apparatus or method of any preceding embodiment, wherein said switching circuit comprises switches controlled by four output levels utilizing a 25% duty cycle I/Q waveforms, to selectively combine voltage outputs from said differential amplifiers and thus eliminate any need of a high power consumption summing circuit.

18. The apparatus or method of any preceding embodiment, wherein said four output levels utilizing a 25% duty cycle I/Q waveforms are generated by a delay-locked loop (DLL) which converts a signal at said first side of said resonator to a differential signal which is fed to a two-stage current-controlled delay line which is controlled by a charge pump whereby it generates quadrature outputs for controlling said switching circuit, and outputting these a logic circuit for outputting control signals to said switching circuit.

19. The apparatus or method of any preceding embodiment, wherein said apparatus operates without requiring said resonator to have a given minimum transconductance (gm) value.

20. The apparatus or method of any preceding embodiment, wherein said amplifier operates at ultra-low power having a power consumption in the picowatt range.

21. The apparatus or method of any preceding embodiment, further comprising a start-up circuit since I/Q signals are unavailable at start-up.

As used herein, the singular terms "a," "an," and "the" may include plural referents unless the context clearly dictates otherwise. Reference to an object in the singular is not intended to mean "one and only one" unless explicitly so stated, but rather "one or more."

Phrasing constructs, such as "A, B and/or C", within the present disclosure describe where either A, B, or C can be present, or any combination of items A, B and C. Phrasing constructs indicating, such as "at least one of" followed by listing group of elements, indicates that at least one of these group elements is present, which includes any possible combination of these listed elements as applicable.

References in this specification referring to "an embodiment", "at least one embodiment" or similar embodiment wording indicates that a particular feature, structure, or characteristic described in connection with a described embodiment is included in at least one embodiment of the present disclosure. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system or method.

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Comparison of the Disclosed XO with **Previous Work

| Parameters | This Work* | VLSI 17 [1] | JSSC'16 [2] | ISSC'14 [3] | JSSC'16 [4] |
|---|---|---|---|---|---|
| Technology (nm) | 65 | 55 | 180 | 28 | 180 |
| Area (mm$^2$) | 0.027 | 0.16 | 0.3 | 0.03 | 0.062 |
| Supply Voltage | 0.5 | 0.5 | 1.2 | 0.2 | 0.3 |
| Power at 25° C. (nW) | 0.55 | 1.7 | 5.58 | 5 | 1.5 |
| Temp. Stability (ppm) | 80 | 109 | 133 | 50 | 150 |
| Line Sensitivity (ppm/V) | 13 | 6.7 | 30.3 | 85 | 7 |
| Allan Deviation (ppb) | 14 | 25 | 10 | 10 | 70 |
| Calibration Required | No | Yes | Yes | No | Yes |

*Averaged across 20 dies with worst-case power of 0.7 nW.
**Previous work references:
[1] Y. Zeng, et al., "A 1.7 nW PLL-assisted current injected 32 KHz crystal oscillator for IoT," 2017 Symposium on VLSI Circuits, pp. C68-C69.
[2] D. Yoon, et al., "A 5.58 nW Crystal Oscillator Using Pulsed Driver for Real-Time Clocks," in IEEE J. of Solid-State Circuits, pp. 509-522, Feb. 2016.
[3] K. Hsiao, "17.7 A 1.89 nW/0.15 V self-charged XO for real-time clock generation," IEEE ISSCC Dig. Tech. Papers, 2014.
[4] A. Shrivastava, et al., "A 1.5 nW, 32.768 KHz XTAL Oscillator Operational From a 0.3 V Supply," in IEEE J. of Solid-State Circuits, pp. 686-696, March 2016.

What is claimed is:

1. An oscillator apparatus, comprising:
   a resonator configured for oscillating and generating resonator current at an oscillation frequency;
   at least one down-converter coupled to a first side of said resonator, said at least one down-converter configured for converting resonator current into direct current (DC);
   at least one direct current (DC) amplifier circuit, having at least one feedback resistance between its input and output, wherein said direct current (DC) amplifier circuit is configured for amplifying the DC current into an amplified DC signal;
   wherein said feedback resistor of the direct current (DC) amplifier circuit has a resistance that exceeds the resistive loss of said resonator; and
   at least one up-converter coupled to a second side of said resonator;
   wherein said at least one up-converter is configured for up-converting the amplified signal back into an oscillation frequency to output an oscillation signal.

2. The apparatus of claim 1, wherein said at least one down-converter and said at least one up-converter comprise mixers.

3. The apparatus of claim 1, wherein said resonator is selected from the group consisting of a crystal, an oscillator, a high-Q oscillator, a crystal oscillator, a Pierce crystal oscillator, a reference oscillator, a low-frequency oscillator, a high-frequency oscillator, a MEMS resonator, a resistor-inductor-capacitor (RLC) resonator, and a clock generator.

4. The apparatus of claim 1, wherein said apparatus operates without a minimum transconductance ($g_m$) requirement of a Pierce oscillator $g_{m,conv.} > \omega_o^2 \cdot C_L^2 \cdot R_m >> g_{m,required}$, wherein $\omega_o$ is operating frequency in radians/second, $C_L$ is total load capacitance and only requires that the DC amplifier's feedback resistor $R_f$ is of a larger resistance value than the resistive loss of the resonator $R_m$, wherein $R_f > R_m$.

5. The apparatus of claim 1, wherein said apparatus comprises two down-converters, two up-converters and two direct current (DC) amplifier circuits, which configure the apparatus with frequency conversion I/Q paths that preserve phase information and ensure a nominal zero phase shift across the resonator.

6. The apparatus of claim 5, wherein said I/Q down-converter is implemented using I/Q mixers which are coupled to the DC amplifier circuits and driven by a delay-locked loop (DLL) configured for deriving binary I/Q signals from said oscillation signal, and suppressing any higher order harmonic content arising from mixing by said at least one direct current (DC) amplifier circuit, which is low-bandwidth, and said resonator which has a high-Q.

7. The apparatus of claim 5, wherein said I/Q up-converter comprises a switching circuit.

8. The apparatus of claim 7, wherein said switching circuit is configured to generate four binary signals, which are all at XO1 frequency, with theta, theta+90, theta+180, theta+270 degrees phase relation where theta is arbitrary, which eliminates any need of a high power consumption summing circuit to drive the resonator.

9. The apparatus of claim 8:
   wherein said at least one direct current (DC) amplifier circuit comprises at least two direct current differential (DC) amplifiers whose differential outputs are directed to a switching circuit; and
   further comprising a delay-locked loop (DLL) which converts a signal at said first side of said resonator to a differential signal which is fed to a two-stage current-controlled delay line which is controlled by a charge pump whereby it generates quadrature outputs for controlling said switching circuit;
   wherein said output oscillation signal is generated in response to switching between four DC voltage levels by a switching circuit controlled by said delay-locked loop (DLL).

10. The apparatus of claim 5, further comprising a start-up circuit to initiate resonator oscillation before the I/Q signals are available.

11. An oscillator apparatus, comprising:
   a resonator configured for oscillating and generating resonator current at an oscillation;
   at least two down-converters configured for converting resonator current into direct current (DC);
   at least two up-converters;
   at least two direct current (DC) amplifier circuits, each having at least one feedback resistance between its input and output, wherein said at least two direct current (DC) amplifier circuits are configured for amplifying the DC current into an amplified DC signal;
   wherein said feedback resistance of the direct current (DC) amplifier circuit has a resistance that exceeds the resistive loss of said resonator;

wherein said at least two down-converters, said at least two up-converters, said at least two direct current (DC) amplifier circuits are configured to provide two I/Q frequency conversion paths comprising an I path and a Q path, that preserve phase information and ensure a nominal zero phase shift across the resonator;

a delay-locked loop (DLL) circuit configured for deriving binary I/Q signals from an oscillation signal, and suppressing any higher order harmonic content arising from mixing by said at least two direct current (DC) amplifier circuits, which are low-bandwidth, and said resonator; and a start-up circuit configured for starting said resonator into oscillations before the I/Q signals are available;

wherein said at least two up-converters are configured for up-converting the amplified signal back to into an oscillation frequency to output an oscillation signal.

12. The apparatus of claim 11, wherein said resonator is selected from the group consisting of a crystal, an oscillator, a high-Q oscillator, a crystal oscillator, a Pierce crystal oscillator, a reference oscillator, a low-frequency oscillator, a high-frequency oscillator, a MEMS resonator, a resistor-inductor-capacitor (RLC) resonator, and a clock generator.

13. The apparatus of claim 11, wherein said apparatus operates without a minimum transconductance ($g_m$) requirement of a Pierce oscillator $g_{m,conv.} > \omega_o^2 \cdot C_L^2 \cdot R_m >> g_{m,required}$, wherein $\omega_o$ is operating frequency in radians/second, $C_L$ is total load capacitance and only requires that the DC amplifier's feedback resistor $R_f$ is of a larger resistance value than the resistive loss of the resonator $R_m$, wherein $R_f > R_m$.

14. The apparatus of claim 11, wherein said at least two direct current (DC) amplifier circuits comprise differential amplifiers, each having feedback resistance between each differential input and respective differential output.

15. The apparatus of claim 14, further comprising a switching circuit coupled to receive output from said differential amplifiers and couple it to the resonator output.

16. The apparatus of claim 15, wherein said switching circuit comprises switches controlled by four output levels utilizing a 25% duty cycle I/Q waveforms, to selectively combine voltage outputs from said differential amplifiers and thus eliminate any need of a high power consumption summing circuit.

17. The apparatus of claim 16, wherein said four output levels utilizing a 25% duty cycle I/Q waveforms are generated by a delay-locked loop (DLL) which converts a signal at said first side of said resonator to a differential signal which is fed to a two-stage current-controlled delay line which is controlled by a charge pump whereby it generates quadrature outputs for controlling said switching circuit, and outputting these a logic circuit for outputting control signals to said switching circuit.

18. A method of generating electrical oscillations, comprising:

down-converting a signal from a first side of a resonator which is configured for oscillating at an oscillation frequency, wherein said down-converting converts resonator current into direct current (DC);

performing direct current (DC) amplification controlled by feedback resistance in generating DC an amplified DC signal;

wherein said feedback resistance exceeds resistive loss of the resonator; and up-converting a signal to a second side of the resonator back into an oscillation frequency.

* * * * *